United States Patent
Yamada

(10) Patent No.: US 8,860,999 B2
(45) Date of Patent: Oct. 14, 2014

(54) CONTROL DEVICE

(71) Applicant: Ryuji Yamada, Ogaki (JP)

(72) Inventor: Ryuji Yamada, Ogaki (JP)

(73) Assignee: Brother Kogyo Kabushiki Kaisha, Nagoya-Shi, Aichi-Ken (JP)

( * ) Notice: Subject to any disclaimer, the term of this patent is extended or adjusted under 35 U.S.C. 154(b) by 54 days.

(21) Appl. No.: 13/662,447

(22) Filed: Oct. 27, 2012

(65) Prior Publication Data

US 2013/0120790 A1    May 16, 2013

(30) Foreign Application Priority Data

Nov. 15, 2011    (JP) .................................. 2011-249436

(51) Int. Cl.
| | | |
|---|---|---|
| *G06F 3/12* | (2006.01) | |
| *H04N 19/102* | (2014.01) | |
| *H04N 1/41* | (2006.01) | |
| *H04N 1/40* | (2006.01) | |
| *H03M 7/30* | (2006.01) | |
| *G06T 9/00* | (2006.01) | |
| *H04N 19/91* | (2014.01) | |
| *H03M 7/48* | (2006.01) | |
| *H04N 19/93* | (2014.01) | |

(52) U.S. Cl.
 CPC ............. *H04N 1/40* (2013.01); *H04N 7/26069* (2013.01); *H04N 1/4105* (2013.01); *H03M 7/30* (2013.01); *G06T 9/005* (2013.01); *H04N 19/00951* (2013.01); *H03M 7/607* (2013.01); *H03M 7/48* (2013.01); *H04N 19/00957* (2013.01)
 USPC .......................................... 358/1.15; 358/1.1

(58) Field of Classification Search
 None
 See application file for complete search history.

(56) References Cited

U.S. PATENT DOCUMENTS

| | | | |
|---|---|---|---|
| 7,221,483 B2 * | 5/2007 | Yagishita et al. ............. | 358/3.13 |
| 7,372,594 B1 * | 5/2008 | Kusakabe et al. ............. | 358/1.9 |
| 7,570,824 B2 * | 8/2009 | Katougi et al. ............... | 382/239 |
| 7,710,599 B2 * | 5/2010 | Miyamoto et al. ............ | 358/1.9 |
| 2002/0031276 A1 * | 3/2002 | Yagishita et al. ............. | 382/252 |
| 2010/0165375 A1 * | 7/2010 | Miyamoto et al. ........... | 358/1.13 |

FOREIGN PATENT DOCUMENTS

| | | |
|---|---|---|
| JP | A-2004-25571 | 1/2004 |
| JP | A-2004-96281 | 3/2004 |
| JP | B-4135439 | 8/2008 |

* cited by examiner

*Primary Examiner* — Marcus T Riley
(74) *Attorney, Agent, or Firm* — Scully, Scott, Murphy & Presser, P.C.

(57) ABSTRACT

A control device includes a binarization processing unit which executes binarization processing on original image data using first and second types of binarization processing methods, and a compression processing unit which executes compression processing on the binary image data using one of a first type of compression processing method appropriate for compression of the binary image data generated using the first type of binarization processing method, and a second type of compression processing method appropriate for compression of the binary image data generated using the second type of binarization processing method. When the binary image data is generated using the first and second types of binarization processing methods, the compression processing unit selects the compression processing method according to a number of using times of the first type of binarization processing method and a number of using times of the second type of binarization processing method.

7 Claims, 17 Drawing Sheets

FIG. 5

BINARIZATION CORRESPONDENCE TABLE 42

| ATTRIBUTE / LEVEL | CHARACTER | GRAPHIC | PHOTOGRAPH |
|---|---|---|---|
| LEVEL 1 | ERROR DIFFUSION | LOW LPI DITHER MATRIX | HIGH LPI DITHER MATRIX |
| LEVEL 2 | HIGH LPI DITHER MATRIX | LOW LPI DITHER MATRIX | HIGH LPI DITHER MATRIX |
| LEVEL 3 | HIGH LPI DITHER MATRIX | LOW LPI DITHER MATRIX | |
| LEVEL 4 | HIGH LPI DITHER MATRIX | | |
| LEVEL 5 | LOW LPI DITHER MATRIX | | |

BINARY IMAGE DATA Im4

BINARY IMAGE DATA Im4

HIGH LPI DITHER MATRIX

LOW LPI DITHER MATRIX

FIG. 11A
REFERENCE ROW
TARGET ROW (Lagr)
FIG. 11B
| PREVIOUS LINE REFERENCE FLAG | NUMBER OF EXPANDING TIMES |
|---|---|

HIGH LPI DITHER MATRIX

LOW LPI DITHER MATRIX

CONTROL DEVICE

CROSS-REFERENCE TO RELATED APPLICATION

This application claims priority from Japanese Patent Application No. 2011-249436, filed on Nov. 15, 2011, the entire subject matter of which is incorporated herein by reference.

TECHNICAL FIELD

Aspects of the present invention relate to a technique of compressing binary image data.

BACKGROUND

In order to enable a print execution unit to print an image, a control device binarizes image data to thus generate binary image data and compresses the binary image data. For example, JP-A-2004-96281 describes a technique which, when executing compression processing, executes first compression processing for a line image area in an image and executing second compression processing for a continuous tone image area in the image.

However, according to related-art techniques, the compression processing may not be appropriately executed.

SUMMARY

Accordingly, an aspect of the present invention provides a technique of executing compression processing on binary image data by an appropriate compression processing method.

According to an illustrative embodiment of the present invention, there is provided a control device including a processor and a memory that stores a computer program, when executed by the processor, causes the control device to function as a binarization processing unit and a compression processing unit. The binarization processing unit is configured to execute binarization processing on original image data by using at least one of plural types of binarization processing methods to generate binary image data. The plural types of binarization processing methods include a first type of binarization processing method and a second type of binarization processing method. The compression processing unit is configured to execute compression processing on the binary image data to generate a compressed image data by using a specific compression processing method which is one of plural types of compression processing methods. The plural types of compression processing methods includes a first type of compression processing method appropriate for compression of the binary image data generated by using the first type of binarization processing method, and a second type of compression processing method appropriate for compression of the binary image data generated by using the second type of binarization processing method. The compression processing unit includes a compression method selection unit which is configured, when the binary image data is generated by using two or more types of binarization processing methods including the first type of binarization processing method and the second type of binarization processing method, to select the specific compression processing method from the plural types of compression processing methods according to a number of using times of the first type of binarization processing method and a number of using times of the second type of binarization processing method. The compression processing unit is configured to execute compression processing on the binary image data by using the selected specific compression processing method.

According to the above configuration, when two or more types of binarization processing methods are used to generate a binary image data, it is possible to execute compression processing by using an appropriate compression processing method, according to the numbers of using times of the respective binarization processing methods.

Also, the present invention can be implemented in various forms such as a method for the control device, a computer program for implementing the functions of the control device or the corresponding method, and non-transitory computer-readable medium having the computer program stored thereon.

BRIEF DESCRIPTION OF THE DRAWINGS

The above and other aspects of the present invention will become more apparent and more readily appreciated from the following description of illustrative embodiments of the present invention taken in conjunction with the attached drawings, in which:

FIG. 5 shows a binarization correspondence table 42;

FIGS. 11A and 11B show a method which is executed when output patterns of a target row and a reference row match with each other in the previous line reference compression method;

DETAILED DESCRIPTION

Illustrative Embodiments (Configuration of Terminal Apparatus)

Figure 1:
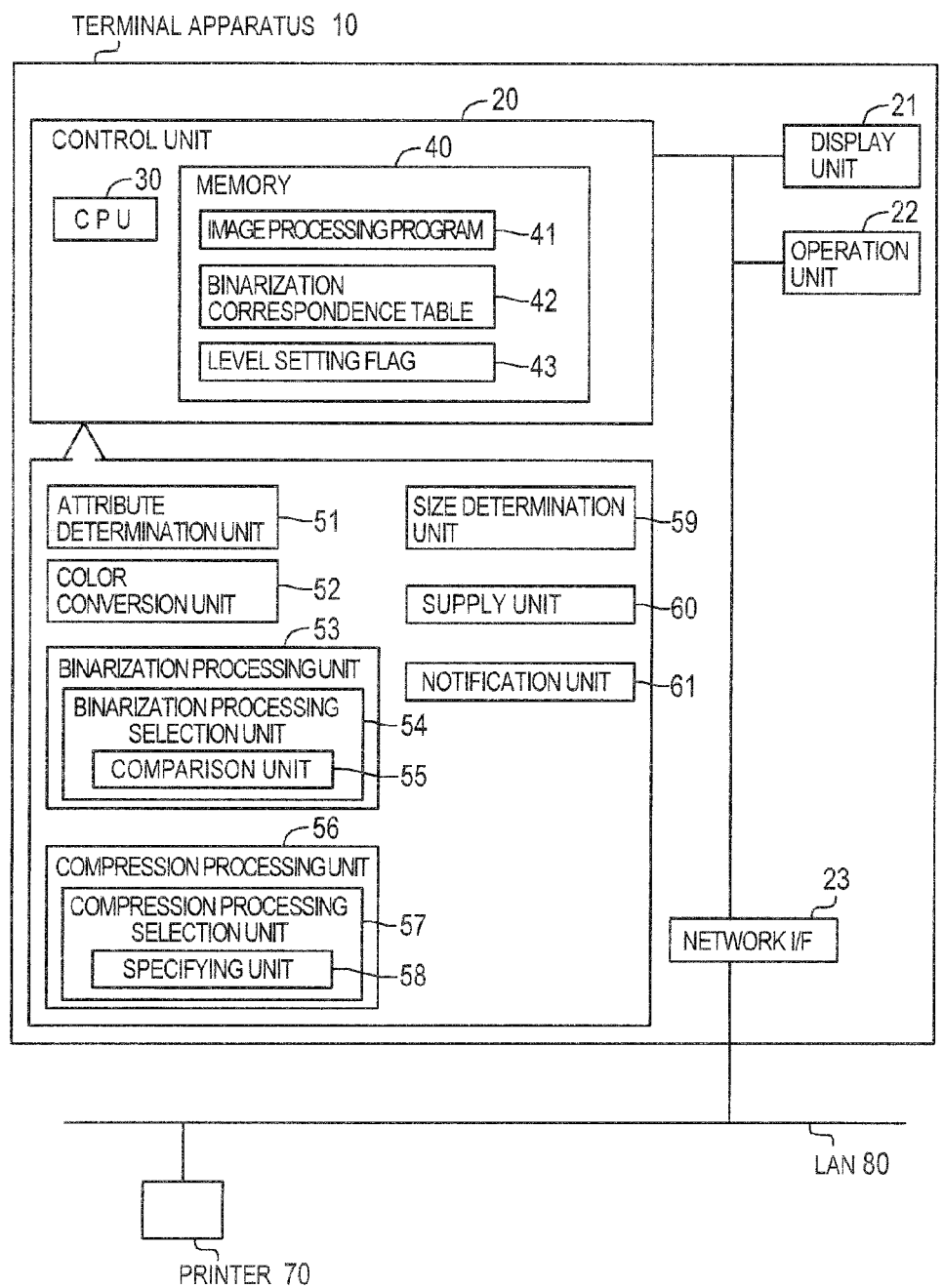
FIG. 1 is a block diagram showing a schematic configuration of a print system.

FIG. 1 is a block diagram showing a schematic configuration of a print system according to an illustrative embodiment.

The print system includes a terminal apparatus 10 and a printer 70. The terminal apparatus 10 and the printer 70 are connected through a LAN (Local Area Network) 80.

The terminal apparatus 10 has a control unit 20, a display unit 21, an operation unit 22 and a network interface 23, which are respectively connected through a bus line. The network interface 23 is connected to the LAN 80.

The control unit 20 includes a CPU 30 and a memory 40. The memory 40 stores therein an image processing program 41. The CPU 30 executes processing based on the image processing program 41, so that functions of respective units 51 to 61 are implemented. Also, the memory 40 stores therein a binarization correspondence table 42 and a level setting flag 43.

In this illustrative embodiment, an attribute determination unit 51 determines attributes of respective areas in an image which is represented by image data. A color conversion unit 52 converts image data which is represented by RGB values into image data which is represented by CMYK values. A binarization processing unit 53 includes a binarization processing selection unit 54 having a comparison unit 55 and executes binarization processing on the image data represented by the CMYK values. A compression processing unit 56 includes a compression processing selection unit 57 having a specifying unit 58 and executes compression processing on binary image data which is generated by the binarization processing. A size determination unit 59 determines whether a size of compressed image data which is generated by the compression processing is larger than a threshold value. A supply unit 60 supplies the compressed image data to the printer 70 when a size of the compressed image data is the threshold value or smaller. A notification unit 61 notifies that the compressed image data cannot be supplied to the printer 70 when a size of the compressed image data is larger the threshold value.

The binarization correspondence table 42 is acquired together with a printer driver at the time when the printer driver is downloaded from an external server (for example, a server which is provided by a vendor of the printer 70). In the meantime, the binarization correspondence table 42 may be provided with being stored in a storage medium such as CD.

The display unit 21 displays a variety of screens. The operation unit 22 has a keyboard, a pointing device and the like. A user can select items displayed on the display unit 21 by operating the operation unit 22.

(Image Processing)

Figure 2:
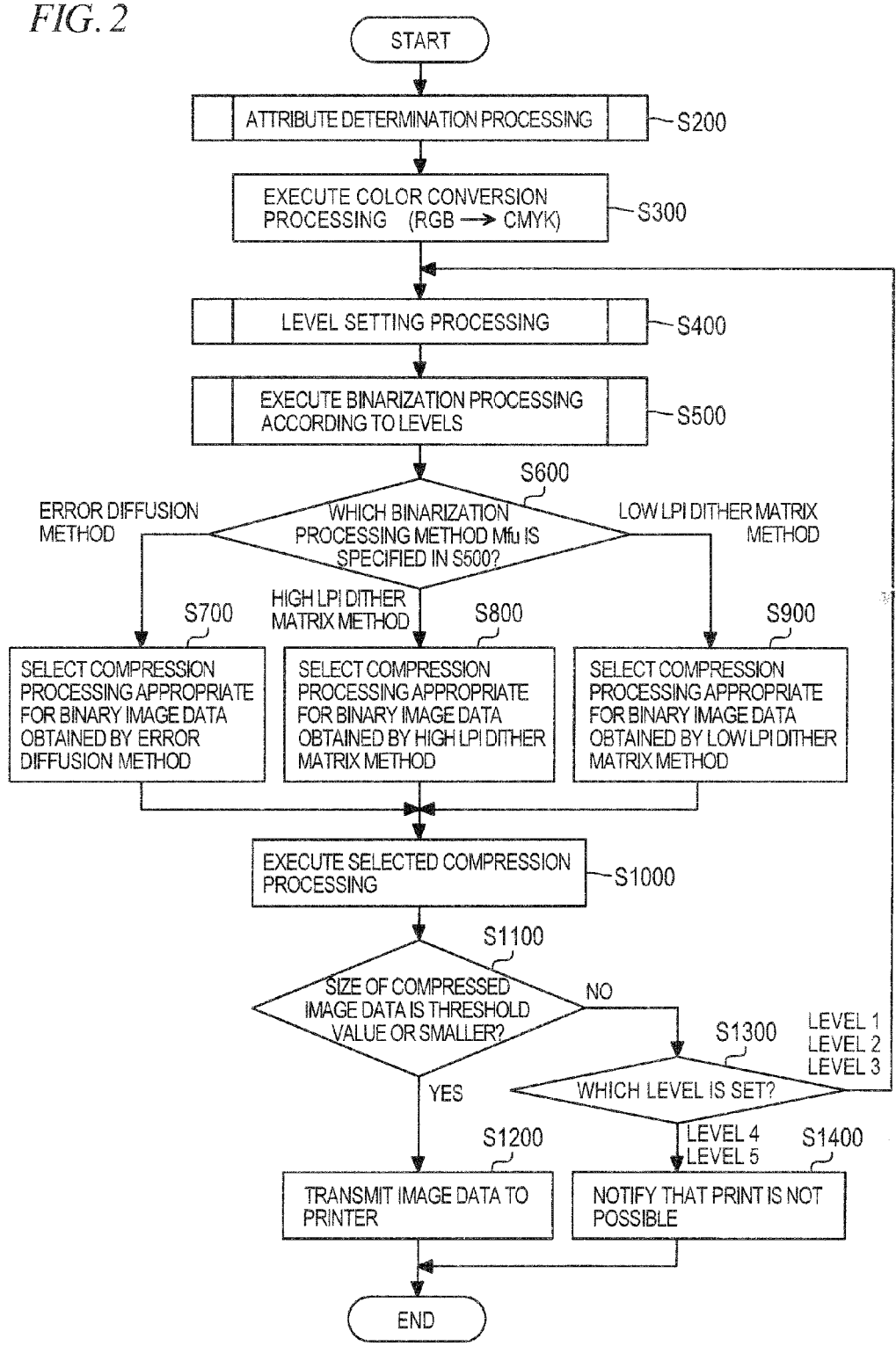
FIG. 2 is a flowchart showing image processing.

FIG. 2 is a flowchart showing image processing which is executed in the illustrative embodiment.

The image processing is started when a user operates the operation unit 22 of the terminal apparatus 10 such that desired image data Im1 is selected and a print is instructed. The image data Im1 is, for example, read out from a portable memory such as USB via a memory mount unit (not shown) of the terminal apparatus 10 and is then stored in the memory 40. The image data Im1 includes parameters indicating a position, a shape, a color and the like of an object.

When the image data Im1 is selected, the attribute determination unit 51 executes processing (attribute determination processing) of determining attributes of the selected image data Im1 (S200).

Figure 3:
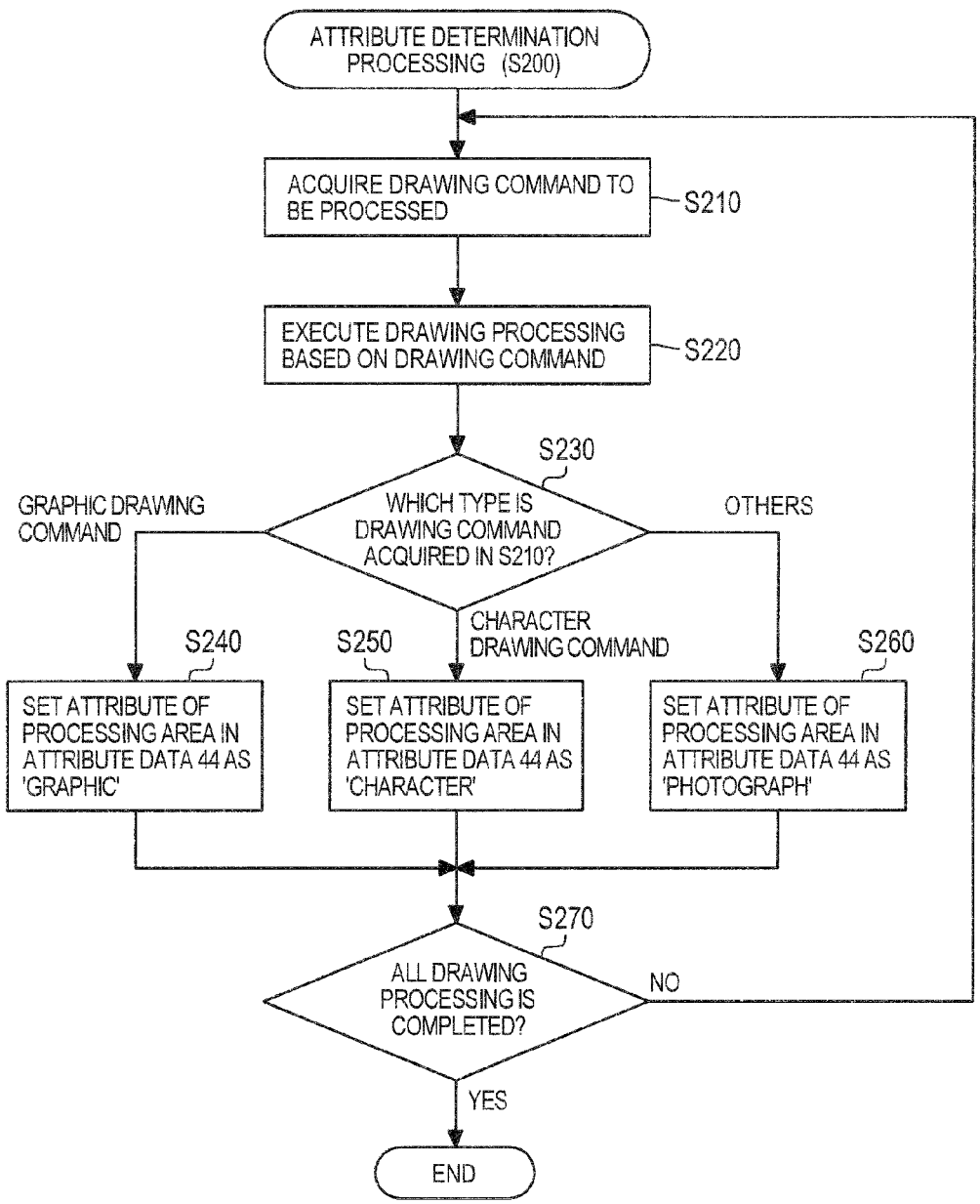
FIG. 3 is a flowchart showing attribute determination processing of FIG. 2.

FIG. 3 is a flowchart showing the attribute determination processing of FIG. 2.

The attribute determination unit 51 acquires a drawing command which should be processed so as to generate image data Im2 based on the image data Im1 (S210). Specifically, the drawing command is a command which is required to generate image data Im2 configured by raster from the image data Im1. In the meantime, the raster is a set of pixels per one line, in which RGB values are given for each pixel.

The attribute determination unit 51 executes drawing processing (rasterizing processing) based on the drawing command (S220). The drawing processing is executed, so that image data Im2 is generated. Pixels configuring the image data Im2 are represented by RGB values of a RGB color space of R (red), G (green) and B (blue). The respective components of the RGB values are represented by 256 tones of 0 to 255, for example.

Subsequently, the attribute determination unit 51 analyzes a character string indicated by the drawing command, thereby determining whether the drawing command is a figure drawing command or a character drawing command (S230). In the meantime, the attribute determination unit 51 may determine the attributes of the respective areas by calculating a pixel density or tone distribution of the image data Im2 on which the drawing processing has been executed.

Figure 4A:
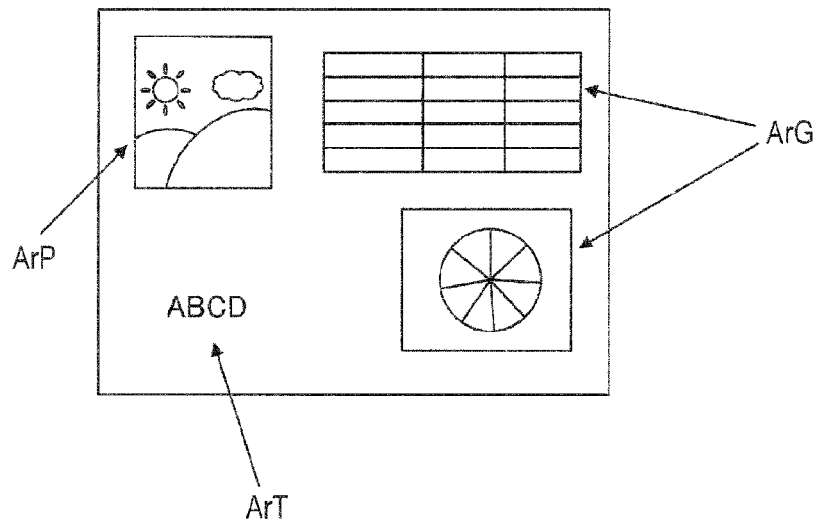
FIGS. 4A and 4B show attribute data 44.
Figure 4B:
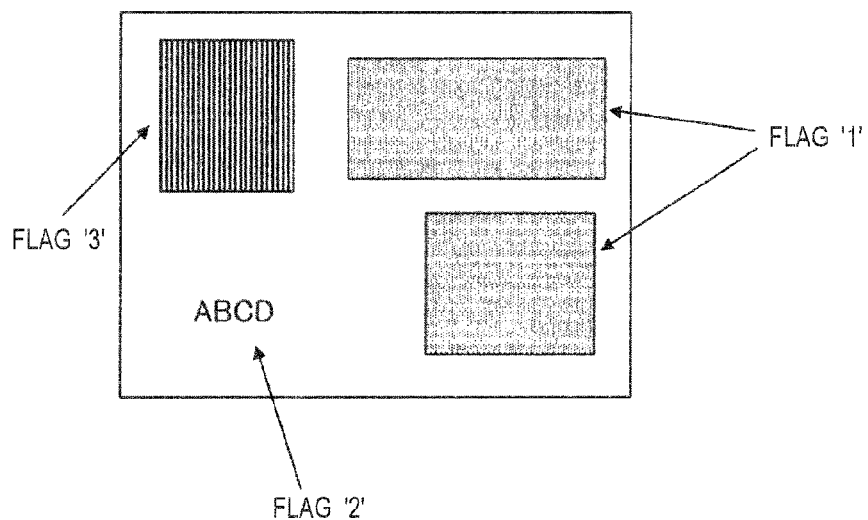

FIGS. 4A and 4B show a correspondence relationship between the image data Im2 which is generated based on the drawing command in S220, and attribute data 44 which is generated based on a result of the determination in S230. FIG. 4A shows an image which is represented by the image data Im2. As shown, an image which is represented by the image data Im2 includes a graphic area ArG, a character area ArT and a photograph area ArP. The graphic area ArG is an area of an object configured by an area in which a figure such as a rectangle and a circle is drawn. The character area ArT is an area in which a character object is drawn, The photograph area ArP is an area of an object configured by an area in which a photographed image is drawn. Each of the objects is configured by one or more areas.

FIG. 4B shows an image which is represented by the attribute data 44, The image includes the three areas corresponding to the three areas ArG, ArT, ArP of FIG. 4A. The attribute data 44 is initialized as '0' in advance.

As shown in FIG. 4B, for example, '1' is stored in the area corresponding to the graphic area ArG, '2' is stored in the area corresponding to the character area ArT, '3' is stored in the area corresponding to the photograph area ArP, and '0' is stored (i.e., the initialized state is held) in an area (in the below, referred to as background area) which does not belong to any of the three areas.

In S230 of FIG. 3, when the drawing command acquired in S210 is a graphic drawing command, the attribute determination unit 51 sets an attribute of the area processed by the drawing command in the attribute data 44 as 'graphic' (S240). Specifically, '1' is stored in pixels which are included in the corresponding area in the image represented by the attribute data 44.

In S230 of FIG. 3, when the drawing command acquired in S210 is a character drawing command, the attribute determination unit 51 sets an attribute of the area processed by the drawing command in the attribute data 44 as 'character' (S250). Specifically, '2' is stored in pixels which are included in the corresponding area in the image represented by the attribute data 44.

Further, in S230 of FIG. 3, when the drawing command acquired in S210 is neither a graphic drawing command nor a character drawing command, the attribute determination unit 51 sets an attribute of the area processed by the drawing command in the attribute data 44 as 'photograph' (S260). Specifically, '3' is stored in pixels which are included in the corresponding area in the image represented by the attribute data 44.

Subsequently, the attribute determination unit 51 determines whether the drawing processing based on all drawing commands included in the image data Im1 has been executed (S270). When there is a drawing command for which the drawing processing has not been executed (NO in S270), the attribute determination unit 51 returns to S210 and selects a drawing command which should be processed next time. On the other hand, when the drawing processing for all the drawing commands has been completed (YES in S270), the attribute determination unit 51 ends the attribute determination processing of FIG. 3.

When the attribute determination processing of FIG. 3 is over, the color conversion unit 52 executes color conversion processing on the image data Im2 on which the drawing processing has been executed (S300). The color conversion unit 52 converts RGB values of the respective pixels of the image data Im2 into CMYK values of a CMYK color space of C (cyan), M (magenta), Y (yellow) and K (black). The respective components of the CMYK values are represented by 256 tones of 0 to 255. The color conversion processing is executed, so that image data Im3 represented by the CMYK values is stored in the memory 40.

Subsequently, the binarization processing unit 53 executes level setting processing (S400).

FIG. 5 shows a binarization correspondence table 42 in which plural levels and a combination of binarization processing to be executed in each level are defined. In this illustrative embodiment, the binarization processing unit 53 executes the binarization processing by using binarization processing methods, which are different for each attribute, depending on set levels. For example, when a set level is Level 1, the binarization processing unit 53 executes the binarization processing by using an error diffusion method for pixels included in an area in which the attribute is 'character' in the attribute data 44. Also, the binarization processing unit 53 executes the binarization processing by using a low lines per inch (LPI) dither matrix method for pixels included in an area in which the attribute is 'graphic' in the attribute data 44. Also, the binarization processing unit 53 executes the binarization processing by using a high LPI dither matrix method for pixels included in an area in which the attribute is 'photograph' in the attribute data 44. The level setting processing (S400) will be specifically described later.

Subsequently, the binarization processing unit 53 executes the binarization processing according to the level set in the level setting processing (S400). The binarization processing is executed, so that a tone value of each pixel included in the image data Im3 is set to be either one of '1' and '0'. In the below descriptions, the configuration that the tone value is set to be '1' is referred to as 'on output' and the configuration that the tone value is set to be '0' is referred to as 'off output.'

Figure 6:
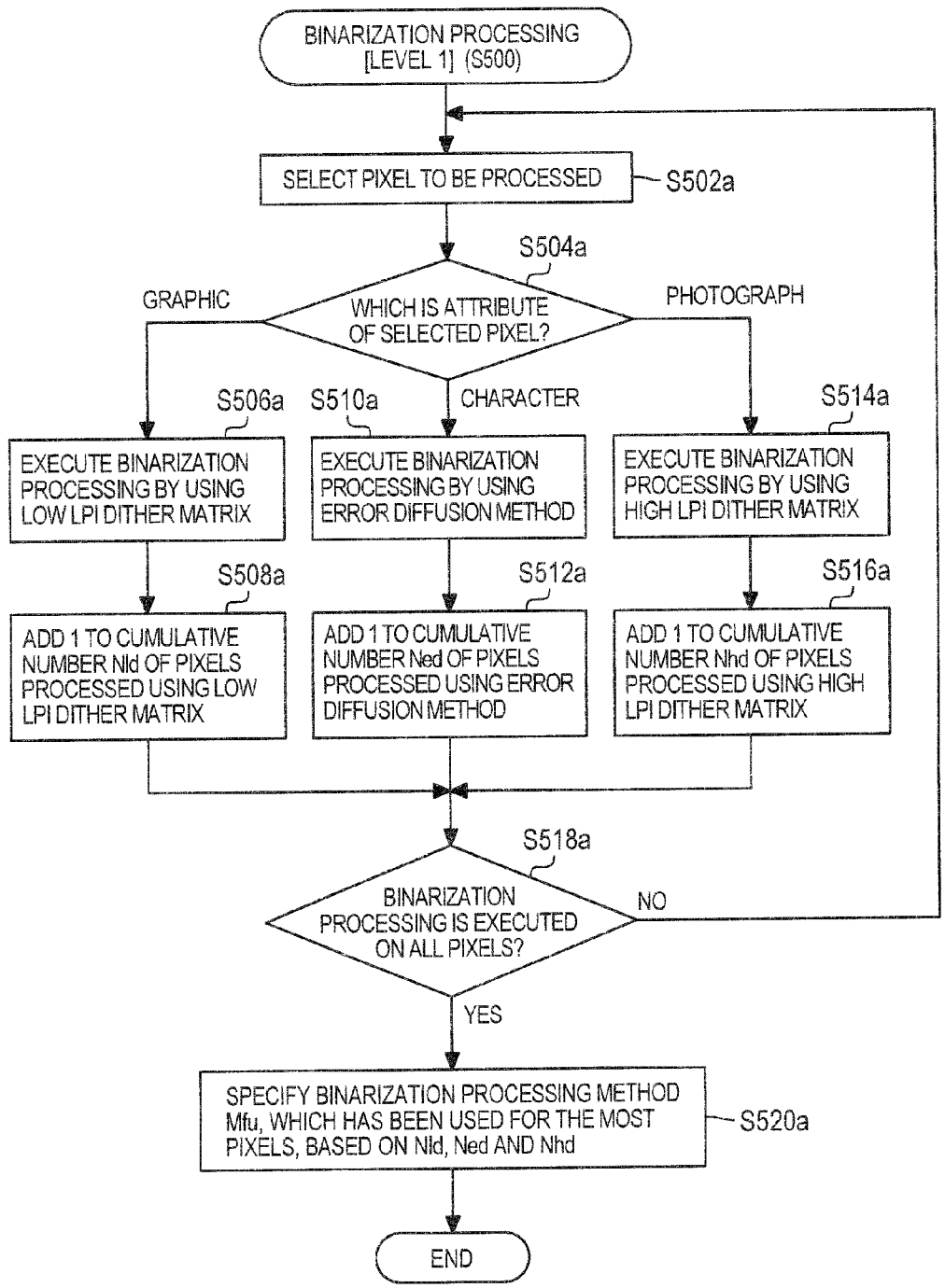
FIG. 6 is a flowchart showing binarization processing (Level 1) of FIG. 2.

FIG. 6 is a flowchart showing binarization processing which is executed when the set level is 'Level 1.' In the meantime, the binarization processing shown in FIG. 6 is executed when the binarization processing (S500) is executed for the first time after the image processing of FIG. 2 starts.

The binarization processing unit 53 selects a pixel to be processed from the image data Im3 on which the color conversion processing of S300 has been executed (S502a). In the meantime, when the processing of S502a is first executed, the binarization processing unit 53 selects a pixel, which is positioned at the head of the image data Im3, as a pixel to be processed.

The binarization processing unit 53 refers to the attribute data 44 which is generated by the attribute determination processing (S200) of FIG. 3, and determines an attribute of the selected pixel (S504a). Specifically, the binarization processing unit determines the value (0 to 3) stored in the pixel in the attribute data 44.

When the determined attribute of the pixel is 'graphic' (graphic in S504a), the binarization processing unit 53 executes the binarization processing on the pixel selected in S502a by using the 'low LPI dither matrix method' which is a binarization processing method corresponding to 'graphic' of 'Level 1' in the binarization correspondence table 42 (S506a). The binarization processing unit 53 adds 1 to a cumulative number Nld of the number of using times of the low LPI dither matrix method (S508a). The cumulative number Nld is a value indicating the number of pixels on which the binarization processing has been executed by using the low LPI dither matrix method.

When the determined attribute of the pixel is 'character' (character in S504a), the binarization processing unit 53 executes the binarization processing on the pixel selected in S502a by using the "error diffusion method" which is a binarization processing method corresponding to 'character' of 'Level 1' in the binarization correspondence table 42 (S510a). The binarization processing unit 53 adds 1 to a cumulative number Ned of the number of using times of the error diffusion method (S512a). The cumulative number Ned is a value indicating the number of pixels on which the binarization processing has been executed by using the error diffusion method.

When the determined attribute of the pixel is 'photograph' (photograph in S504a), the binarization processing unit 53 executes the binarization processing on the pixel selected in S502a by using the 'high LPI dither matrix method' which is a binarization processing method corresponding to 'photograph' of 'Level 1' in the binarization correspondence table 42 (S514a). The binarization processing unit 53 adds 1 to a cumulative number Nhd of the number of using times of the high LPI dither matrix method (S516a). The cumulative number Nhd is a value indicating the number of pixels on which the binarization processing has been executed by using the high LPI dither matrix method.

In the meantime, although not shown in FIG. 6, when the pixel selected in S502a is a pixel included in the background area, the binarization processing unit 53 executes the binarization processing on the selected pixel by using the 'low LPI dither matrix method' in all levels. When the background area is an area in which nothing is printed (i.e., all the respective components of the CMYK values are zero), all pixels included in the background area are off-output. When the background area is an area of the same color (i.e., the CMYK values are the same), a part pixel of the pixels included in the background area is on-output. In the meantime, it may be possible to execute the binarization processing on pixels included in the background area by using the other binarization processing method.

When any one processing of S508a, S512a and S516a is executed, the binarization processing unit 53 determines whether the binarization processing has been executed on all pixels included in the image data (S518a). When there is a pixel on which the binarization processing has not executed yet (NO in S518a), the binarization processing unit 53 returns to S502a and selects a pixel which should be processed next.

On the other hand, when the binarization processing has been executed on all pixels (YES in S518a), the specifying unit 58 specifies a binarization processing method Mfu, which has been executed on the most pixels, of the binarization processing methods executed on the pixels included in the image data (S520a). Specifically, in the binarization processing of Level 1, the specifying unit 58 determines the largest cumulative number from the cumulative number Nld, the cumulative number Ned and the cumulative number Nhd, and specifies the binarization processing method Mfu corresponding to the largest cumulative number. For example, when the cumulative number Nld is largest among the three cumulative numbers Nld, Ned, Nhd, the specifying unit 58 specifies the low LPI dither matrix method as the binarization processing method Mfu.

When the binarization processing method Mfu is specified, the binarization processing unit 53 ends the binarization processing of FIG. 6. That is, the binarization processing (S500) is executed, so that the image data Im3, which is represented by the CMYK values, is converted into binary image data Im4.

Here, the respective binarization processing methods are described. The error diffusion method is a binarization processing method of collecting differences between a threshold value (for example, 128) and input values (for example, 256 tones of 0 to 255) as error values and feed backing (adding or subtracting) error values collected from plural pixels to an input value of a non-processed pixel. In the meantime, the dither matrix method is a method of comparing input values (for example, 256 tones of 0 to 255) and a threshold value set in a matrix of N×N (N: natural number) one to one and determining an output value (for example, two tones of 0 or 1).

Figure 7A:
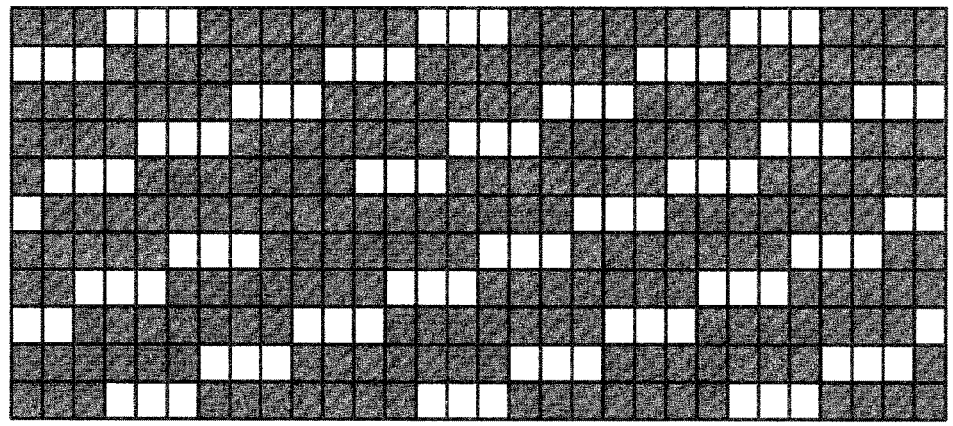
FIGS. 7A and 7B show an example of image data which is output by a dither matrix.
Figure 7B:
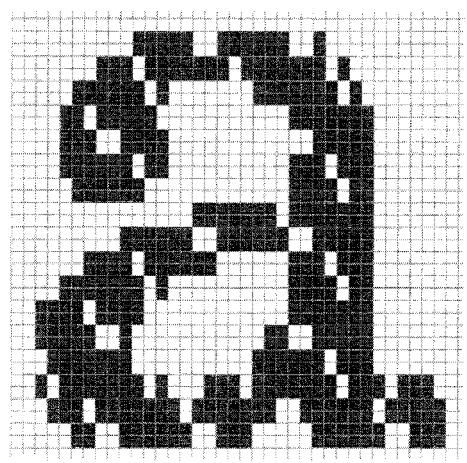

FIGS. 7A and 7B show an example of the binary image data Im4 which is output by a dither matrix. FIG. 7A shows the binary image data Im4 which is obtained when the binarization processing is executed for the area of the same color by using a dither matrix. One row in a horizontal direction indicates one row of the image data. In FIG. 7A, a pixel which is on-output by the binarization processing is indicated with a gray and a pixel which is off-output is indicated with a white.

As shown in FIG. 7A, when the binarization processing is executed on the background area of the same color by using the dither matrix, pixels which are on-output and pixels which are off-output appear in a certain regular pattern. In FIG. 7A, seven pixels which are on-output consecutively appear in the horizontal direction and then three pixels which are off-output consecutively appear in the horizontal direction. In this case, the image data having 70% density is output.

FIG. 7B shows the binary image data Im4 which is obtained when the binarization processing is executed on the character area by using the dither matrix. As shown, when the binarization processing is executed on the character area by using the dither matrix, some of pixels configuring a character in the character area are off-output.

In this illustrative embodiment, the dither matrix having different screen angles is used for each color of CMYK. Therefore, a pattern in which on-output pixels and off-output pixels appear is different for each color. Here, the screen angle means an angle which is formed between a direction of a line (in the below, referred to as a consecutive pixel line) connecting centers of respective pixels and a row direction when the on-output pixels consecutively appear.

Also, in this illustrative embodiment, when executing the binarization processing by using the dither matrix, the binarization processing is executed by using two dither matrices of the high LPI dither matrix and the low LPI dither matrix. Therefore, there are eight types of the dither matrices (four colors of CMYK×two types of dither matrices) which are used in this illustrative embodiment. The high LPI dither matrix is a dither matrix having more screen lines than the low LPI dither matrix has, In the meantime, the screen lines mean the number of consecutive pixel lines included per unit length.

Figure 8A:
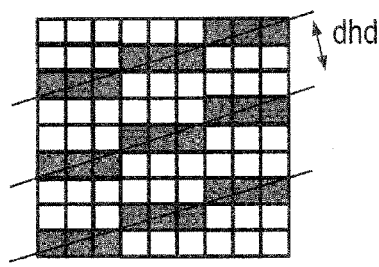
FIGS. 8A and 8B show a difference between a high LPI (lines per inch) dither matrix and a low LPI dither matrix.
Figure 8B:
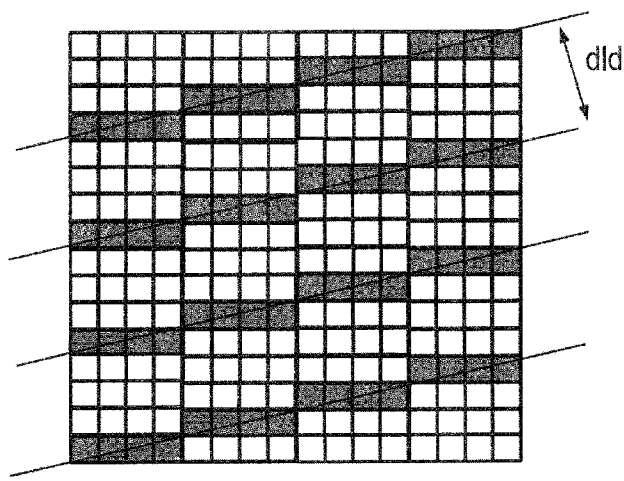

FIGS. 8A and 8B show a difference between the high LPI dither matrix and the low LPI dither matrix. In FIGS. 8A and 8B, the pixels which are on-output are indicated with a gray and the pixels which are off-output are indicated with a white. FIG. 8A shows the binary image data Im4 which is generated when the binarization processing is executed on a specific image data Im3 by using the high LPI dither matrix. In FIG. 8A, an interval dhd indicates an interval between the consecutive pixel lines, In the meantime, FIG. 8B shows the binary image data Im4 which is generated when the binarization processing is executed on the same specific image data Im3 by using the low LPI dither matrix. In FIG. 8B, an interval did indicates an interval between two lines connecting the consecutive pixel lines. As shown, the interval dhd of the lines appearing when the binarization processing is executed by using the high LPI dither matrix is narrower than the interval of the lines appearing when the binarization processing is executed by using the low LPI dither matrix. In other words, the screen lines, which are obtained when the binarization processing is executed by using the high LPI dither matrix, is larger than the screen lines which is obtained when the binarization processing is executed by using the low LPI dither matrix.

When the binarization processing (S500) according to the set levels is over, the compression processing unit 56 determines whether the binarization processing method Mfu, which is specified in the binarization processing (S520a of FIG. 6 when the set level is Level 1), is the error diffusion method, the high LPI dither matrix method or low LPI dither matrix method, in the image processing of FIG. 2 (S600).

When the specified binarization processing method Mfu is the 'error diffusion method', the compression processing selection unit 57 selects a compression processing method appropriate for the error diffusion method from plural compression processing methods (S700). Specifically, the compression processing selection unit 57 selects a flate compression method as the compression method to be executed. The flate compression method is a compression method using a combination of LZ77 algorithm and Huffman encoding.

When the specified binarization processing method Mfu is the 'high LPI dither matrix method', the compression processing selection unit 57 selects a compression processing method appropriate for the high LPI dither matrix method from the plural compression processing methods (S800). Specifically, the compression processing selection unit 57 selects a previous line reference compression method, as the compression method to be executed.

When the specified binarization processing method Mfu is the 'low LPI dither matrix method' (low LPI dither matrix method in S600), the compression processing selection unit 57 selects compression processing appropriate for the low LPI dither matrix method from the plural compression processing methods (S900). Specifically, the compression processing selection unit 57 selects a previous line reference compression method, as the compression method to be executed.

The previous line reference compression method is a compression method of comparing an output pattern of a specific row (referred to as a target row) in the binary image data Im4 and an output pattern of a row (referred to as a reference row) of one previous line of the target row in the binary image data Im4 and compressing the binary image data Im4.

Figure 9:
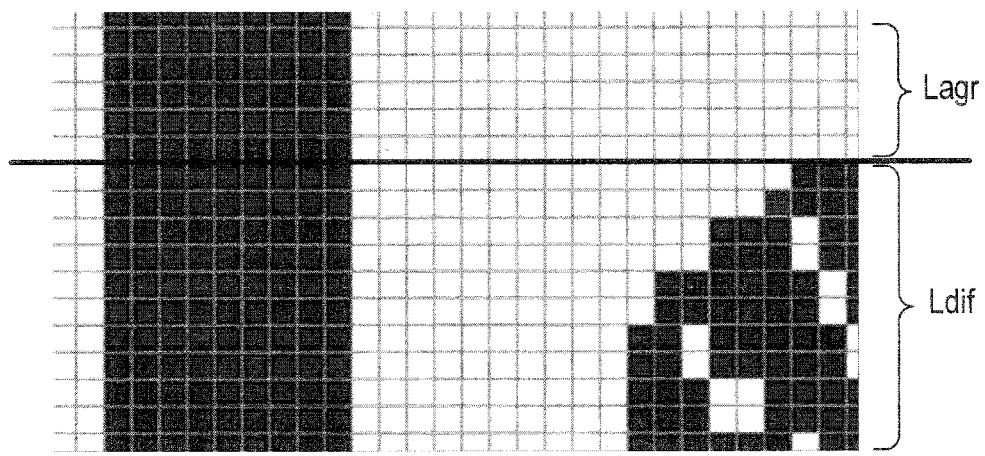
FIG. 9 shows an example of binary image data before compression processing (S1000) of FIG. 2 is executed.

FIG. 9 shows an example of the binary image data Im4 before the compression processing (S1000) of FIG. 2 is executed. As shown, the respective rows included in the binary image data Im4 are classified into two types of Lagr and Ldif. Lagr indicates a target row in which an output pattern of the target row matches with an output pattern of the reference row. Ldif indicates a target row in which an output pattern of the target row does not match with an output pattern of the reference row.

Figure 10A:
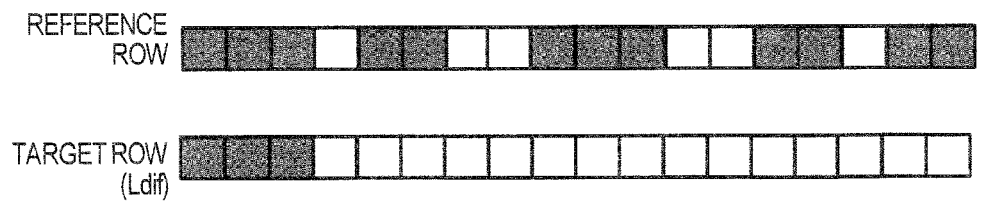
FIGS. 10A to 10D show a method which is executed when output patterns of a target row and a reference row do not match with each other in a previous line reference compression method.

FIGS. 10A to 10D show a compression method which is used when an output pattern of the target row does not match with an output pattern of the reference row, FIG. 10(A) shows a specific example where an output pattern of the target row is not consistent with an output pattern of the reference row. As shown, the target row has an output pattern different from that of the reference row. Accordingly, the target row is determined as Ldif.

Figure 10B:

FIG. 10B shows a comparison pixel group for defining compression data of Ldif. As shown, plural on/off patterns of pixels is defined in the comparison pixel group. The memory 40 pre-stores therein plural comparison pixel groups having different patterns. For example, when the comparison pixel group is composed of three pixels, the memory 40 stores therein eight comparison pixel groups of 2×2×2. For example, the comparison pixel group indicated by the number 1 in FIG. 10B indicates a pattern in which all the three pixels are on-output.

Figure 10C:
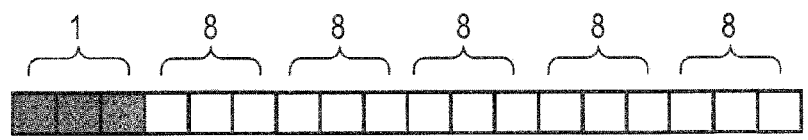

FIG. 10C shows a correspondence relationship between the comparison pixel group of FIG. 10B and pixels included in Ldif. The compression data of Ldif includes information indicating which comparison pixel group and how many times the comparison pixel group appear consecutively by using a Run-Length Encoding method. As shown, Ldif shown in FIG. 10A is configured by the comparison pixel group of the number 1 of FIG. 10B which appears one time, and the comparison pixel group of the number 8 of FIG. 10B, which consecutively appears five times, in order from the head. Therefore, a numerical sequence of '1185' is stored in the compression data of Ldif.

Figure 10D:
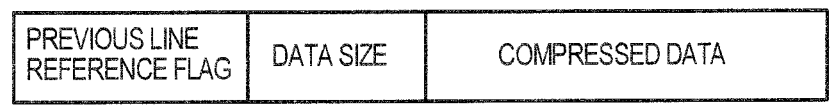

FIG. 10D shows the compression data when the data of Ldif is compressed. The compression data of Ldif includes a previous line reference flag, data size information and compression data. The previous line reference flag stores information (for example, flag information of '0') indicating that output patterns of the target row and the reference row do not match with each other (i.e., indicating Ldif). The data size information stores information indicating a data size of the compressed data using the Run-Length Encoding method. The compressed data stores data (for example, information indicating the numerical sequence of '1185') compressed by using the Run-Length Encoding method.

In the meantime, when the uppermost row of the binary image data Im4 is the target row, there is no reference row. Therefore, the comparison pixel groups are used to generate the compression data by the Run-Length Encoding method.

FIG. 11 shows a compression method when the output patterns of the target row and the reference row match with each other. FIG. 11A shows a specific example where the output patterns of the target row and the reference row match with each other. As shown, the target row has the same output pattern as that of the reference row. Therefore, the target row is determined as Lagr.

FIG. 11B shows the compression data when the data of Lagr is compressed. The compression data of Lagr includes a previous line reference flag and information of the number of expanding times. The previous line reference flag stores information (for example, flag information of '1') indicating that output patterns of the target row and the reference row match with each other (i.e., indicating Lagr). The information of the number of expanding times stores information indicating how many lines Lagr appear consecutively in a vertical direction. For example, when Lagr consecutively appears by ten lines in the vertical direction, '10' is stored in the information of the number of expanding times.

As shown in FIGS. 10A to 10D, in this illustrative embodiment, when compressing the binary image data Im4 by the previous line reference compression method, if the output pattern of the reference row and the output pattern of the target row do not match with each other, the compression data is generated by using the comparison pixel group. Here, the number of pixels to be included in the comparison pixel group is preferably determined in accordance with the type of the dither matrix used in the binarization processing. Thus, in this illustrative embodiment, the different comparison pixel groups are respectively used to generate the compression data in a case where the binarization processing is executed by using the high LPI dither matrix method and in a case where the binarization processing is executed by using the low LPI matrix method.

Figure 12A:
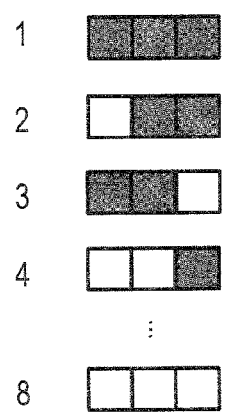
FIGS. 12A and 12B show a correspondence relationship between a binarization processing method and comparison pixel groups.
Figure 12B:
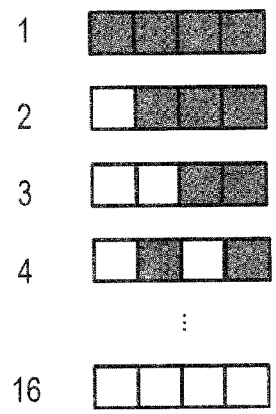

FIGS. 12A and 12B show a correspondence relationship between the binarization processing method and comparison pixel groups. FIG. 12A shows comparison pixel groups which are used when compressing the binary image data Im4 on which the binarization processing has been executed by using the high LPI dither matrix method. FIG. 12B shows comparison pixel groups which are used when compressing the binary image data Im4 on which the binarization processing has been executed by using the low LPI dither matrix method. As shown, in this illustrative embodiment, the number of pixels (for example, three pixels) of the comparison pixel group, which is used when compressing the binary image data Im4 on which the high LPI dither matrix method has been used, is stored in the memory such that it is smaller than the number of pixels (for example, four pixels) of the comparison pixel group, which is used when compressing the binary image data Im4 on which the low LPI dither matrix method has been used. In other words, the number of patterns (for example, when the number of pixels configuring the comparison pixel group is 3 pixels, $2^3=8$ patterns) of the comparison pixel group, which is used when compressing the binary image data Im4 on which the high LPI dither matrix method has been used, is stored in the memory 40 such that it is smaller than the number of patterns (for example, when the number of pixels configuring the comparison pixel group is 4 pixels, $2^4=16$ patterns) of the comparison pixel group, which is used when compressing the binary image data Im4 for which the low LPI dither matrix method has been used. That is, the different comparison pixel groups are respectively used to generate the compression data in the case where the binarization processing is executed by using the high LPI dither matrix method and in the case where the binarization processing is executed by using the low LPI matrix method. Thereby, it is possible to effectively reduce the size of the compression data.

Next, a correspondence relationship between the binarization processing method and the compression processing method is discussed. As described above, the error diffusion method is a binarization processing method of collecting differences between a threshold value (for example, 128) and input values (for example, 256 tones of 0 to 255) as error values and feed backing (adding or subtracting) the error values collected from the pixels to an input value of a non-processed pixel. Therefore, whether the non-processed pixel is on-output depends on the feedback value. As a result, a frequency that a specific pixel group, which is configured by plural pixels having a specific on/off pattern, appears in the binary image data Im4 tends to be smaller than a frequency that the specific pixel group appears in the binary image data Im4 for which the binarization processing has been executed by using the dither matrix. The flate compression method has been known as a method which is efficient when compressing the binary image data Im4 in which the pattern of pixels in the binary image data Im4 does not tend to become similar (that is, in which the frequency that the specific image group appears in the binary image data Im4 is smaller than a specific frequency (for example, 50%)). Accordingly, in this illustrative embodiment, when compressing the binary image data Im4 on which the binarization processing has been executed by using the error diffusion method, the flate compression method is used to generate compressed image data Im5.

In the meantime, as shown in FIGS. 7A and 7B, in the binarization processing method using the dither matrix, a frequency that a specific pixel group configured by plural pixels having a specific on/off pattern appears tends to be larger than a frequency that the specific pixel group appears in the binary image data Im4 on which the binarization processing has been executed by using the error diffusion method. As described above, in the previous line reference compression method, an output pattern of a specific row (target row) in the binary image data Im4 and an output pattern of a row (reference row) of one previous line of the target row in the binary image data Im4 are compared. When the patterns of the pixels of the two rows match with each other, the information indicating that the two rows match with each other is just stored. Also, even when the two rows do not match with each other, the information indicating that parts having the same consecutive dither pattern of plural dither patterns shown in FIG. 11B appear consecutively (for example, the information indicating that the dither pattern number '2' of FIG. 10B consecutively appear four times) is just stored. That is, the previous line reference compression method is considered as a method which is efficient when compressing the binary image data Im4 in which the pattern of pixels tends to become similar (that is, in which the frequency that the specific image group appears in the binary image data Im4 is a specific frequency (for example, 50%) or larger), Accordingly, in this illustrative embodiment, when compressing the binary image data Im4 on which the binarization processing has been executed by using the dither matrix (high LPI dither matrix, low LPI dither matrix), the previous line reference compression method is used to generate the compressed image data Im5.

In the image processing of FIG. 2, the compression processing unit 56 compresses the binary image data Im4 by the selected compression processing method (S1000). Thereby, the binary image data Im4 is converted into compressed image data Im5.

When the compressed image data Im5 is generated, the size determination unit 59 determines whether a size of the compressed image data Im5 is a threshold value or smaller (S1100). The threshold value is a value which is determined depending on a maximum size which is permitted to transmit the compressed image data to the printer 70.

When a size of the compressed image data Im5 is the threshold value or smaller (YES in S1100), the supply unit 60 supplies the compressed image data Im5 to the printer 70 (S1200). Then, the printer 70 expands the supplied compressed image data Im5 and can print the expanded binary image data Im4.

On the other hand, when a size of the compressed image data Im5 is larger than the threshold value (NO in S1100), the compressed image data Im5 cannot be transmitted to the printer 70. Therefore, the binary processing unit 53 determines the set level with reference to the level setting flag 43 (S1300).

When the level set with the level setting flag 43 is either one of Level 1, Level 2 and Level 3 (Level 1, Level 2, Level 3 in S1300), the binarization processing unit 53 executes the level setting processing (S400), thereby setting a new level.

That is, in order to reduce the size of the compressed image data Im5 when the size of the compressed image data Im5 is larger than the threshold value, the binarization processing unit 53 sets a new level and again executes the binarization processing by using the binarization processing method according to the newly set level, thereby again generating the binary image data Im4. Accordingly, the compression processing unit 56 can generate the compressed image data Im5 (which is not permitted to be transmitted to the printer 70) such that a size thereof is reduced. As a result, a possibility that the compressed image data Im5 can be transmitted to the printer 70 is increased.

Meanwhile, in the image processing of FIG. 2, when the level set with the level setting flag 43 is either one of Level 4 and Level 5, since it is not possible to supply the compressed image data to the printer 70, the notification unit 61 notifies the printer 70 that the execution of print is not possible (S1400).

Figure 13:
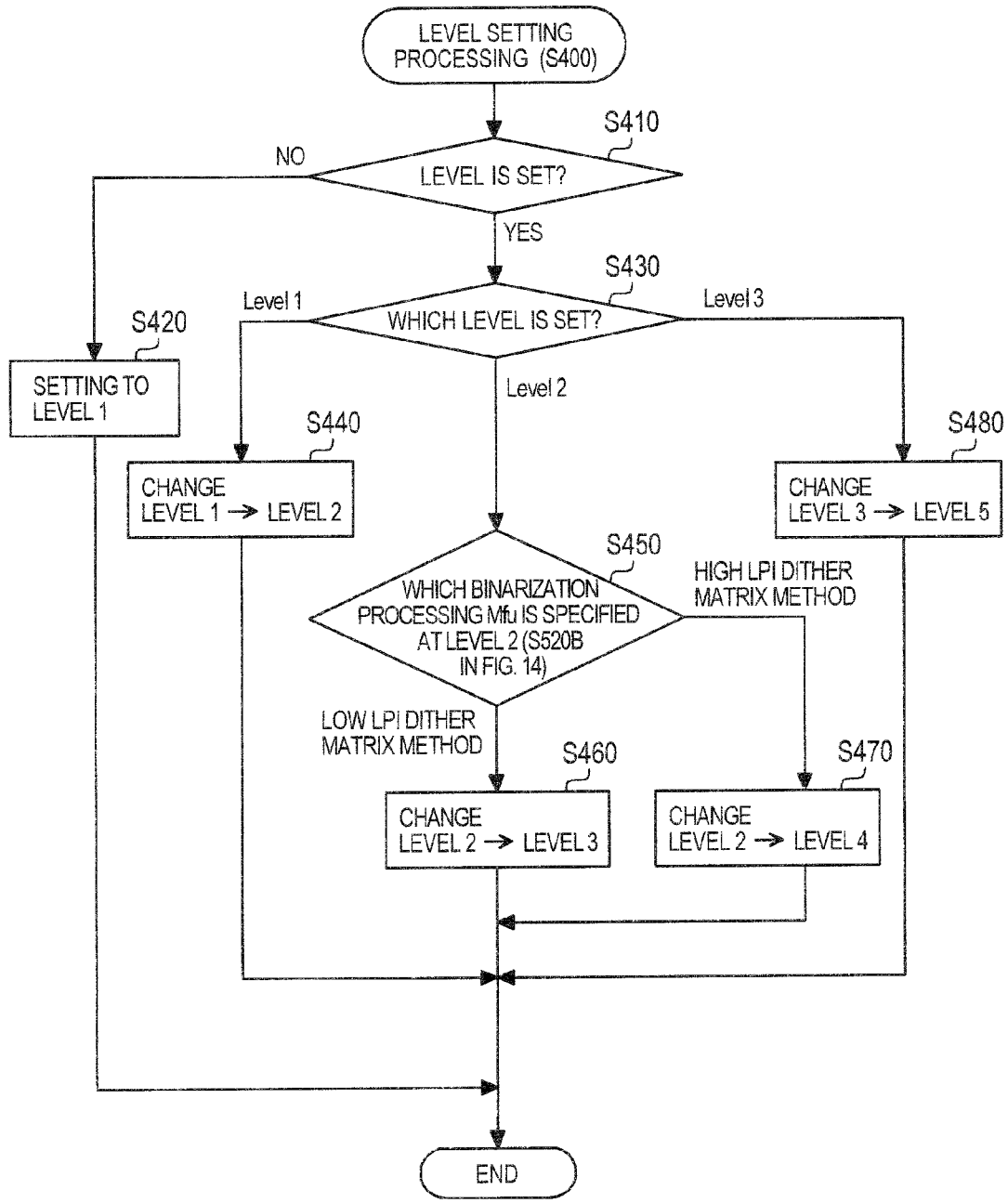
FIG. 13 is a flowchart showing level setting processing of FIG. 2.

FIG. 13 shows a flowchart showing the level setting processing of the present illustrative embodiment.

A binarization processing selection unit 54 determines whether the level has been already set or not (S410). Specifically, the binarization processing selection unit 54 refers to the level setting flag 43 to thus determine whether the information indicating any one level has been already set.

When the level has not been set yet (NO in S410), the binarization processing selection unit 54 stores the information indicating '1' in the level setting flag 43 such that a combination of binarization processing of 'Level 1' in the binarization correspondence table 42 is selected (S420). Here, a case where a result of the determination in S410 is NO would include a case where the level setting processing is executed for the first time after the image processing of FIG. 2 starts.

On the other hand, when the level has been already set (YES in S410), the binarization processing selection unit 54 determines the currently set level (S430). Specifically, the binarization processing selection unit 54 refers to the level setting flag 43 to thus determine to which of Level 1, Level 2 and Level 3 the set level corresponds.

When the level set in the level setting flag 43 is 'Level 1' (Level 1 in S430), the binarization processing selection unit 54 changes the level set in the level setting flag 43 to 'Level 2' (S440).

Figure 14:
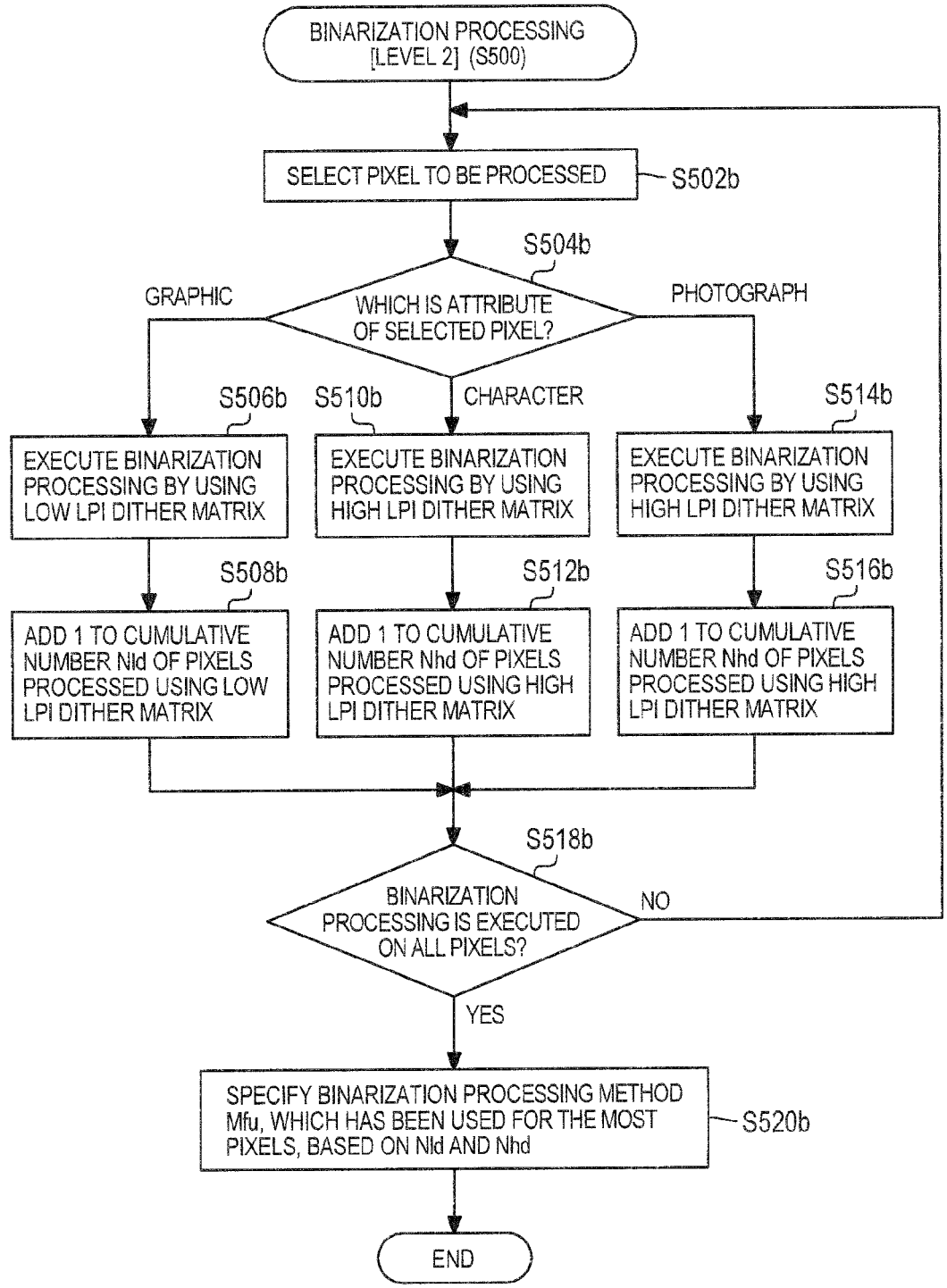
FIG. 14 is a flowchart showing binarization processing (Level 2)

When the level set in the level setting flag 43 is 'Level 2' (Level 2 in S430), the comparison unit 55 determines which of the low LPI dither matrix method and the high LPI dither matrix method, the binarization processing method Mfu specified in S520b of the binarization processing of FIG. 14 corresponds to (S450).

When the specified binarization processing method Mfu is the low LPI dither matrix (low LPI dither matrix in S450), the binarization processing selection unit 54 changes the level set in the level setting flag 43 to 'Level 3' (S460).

When the specified binarization processing method Mfu is the high LPI dither matrix (high LPI dither matrix in S450), the binarization processing selection unit 54 changes the level set in the level setting flag 43 to 'Level 4' (S470).

In the level setting processing of FIG. 13, when the set level is 'Level 3' (Level 3 in S430), the binarization method selection unit changes the level set in the level setting flag 43 to 'Level 5' (S480).

In the below, the binarization processing which is executed when the set level is either one of Level 2 to Level 5 is described.

FIG. 14 is a flowchart showing the binarization processing which is executed at Level 2.

Similarly to the binarization processing which is executed at Level 1, the binarization processing unit 53 selects a pixel to be processed (S502b) and determines an attribute of the selected pixel (S504b). At Level 2, as shown in the binarization correspondence table 42 of FIG. 5, when the attribute of the pixel is 'graphic', the binarization processing unit executes the binarization processing by using the low LPI dither matrix method (S506b, S508b). When the attribute of the pixel is 'character', the binarization processing unit executes the binarization processing by using the high LPI dither matrix method (S510b, S512b). Also, when the attribute of the pixel is 'photograph', the binarization processing unit 53 executes the binarization processing by using the high LPI dither matrix method (S514b, S516b). When the binarization processing is executed on all the pixels (YES in S518b), the specifying unit 58 specifies the binarization processing method Mfu which has been most used (S520b).

Figure 15:
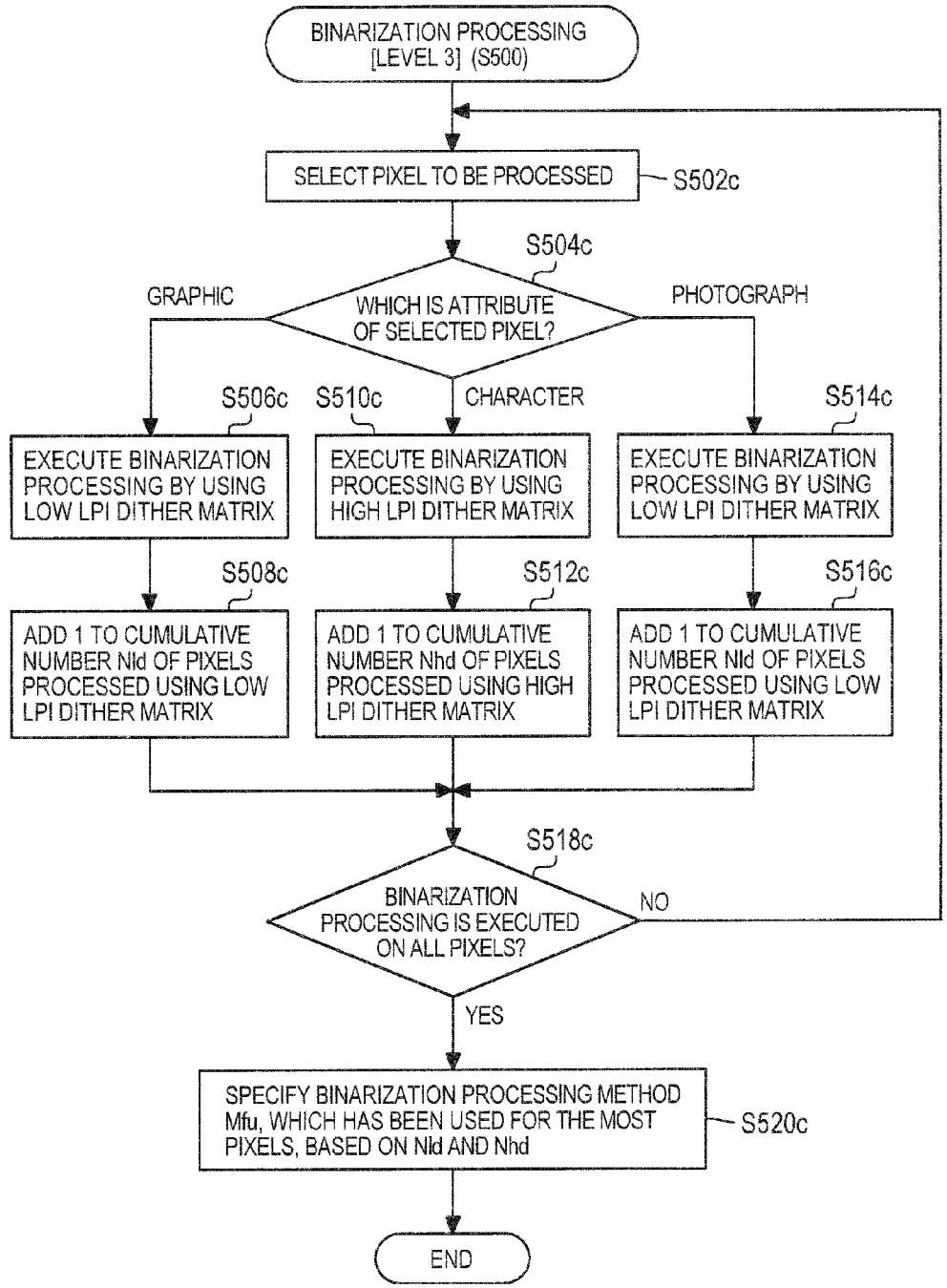
FIG. 15 is a flowchart showing binarization processing (Level 3)

FIG. 15 is a flowchart showing the binarization processing which is executed at Level 3.

Similarly to the binarization processing which is executed at Level 1, the binarization processing unit 53 selects a pixel to be processed (S502c) and determines an attribute of the selected pixel (S504c). At Level 3, as shown in the binarization correspondence table 42 of FIG. 5, when the attribute of the pixel is 'graphic', the binarization processing unit executes the binarization processing by using the low LPI dither matrix method (S506c, S508c). Also, when the attribute of the pixel is 'character', the binarization processing unit executes the binarization processing by using the high LPI dither matrix method (S510c. S512c). Also, when the attribute of the pixel is 'photograph', the binarization processing unit 53 executes the binarization processing by using the low LPI dither matrix method (S514c, S516c). When the binarization processing is executed on all the pixels (YES in S518c), the specifying unit 58 specifies the binarization processing method Mfu that has been most used (S520c).

Figure 16:
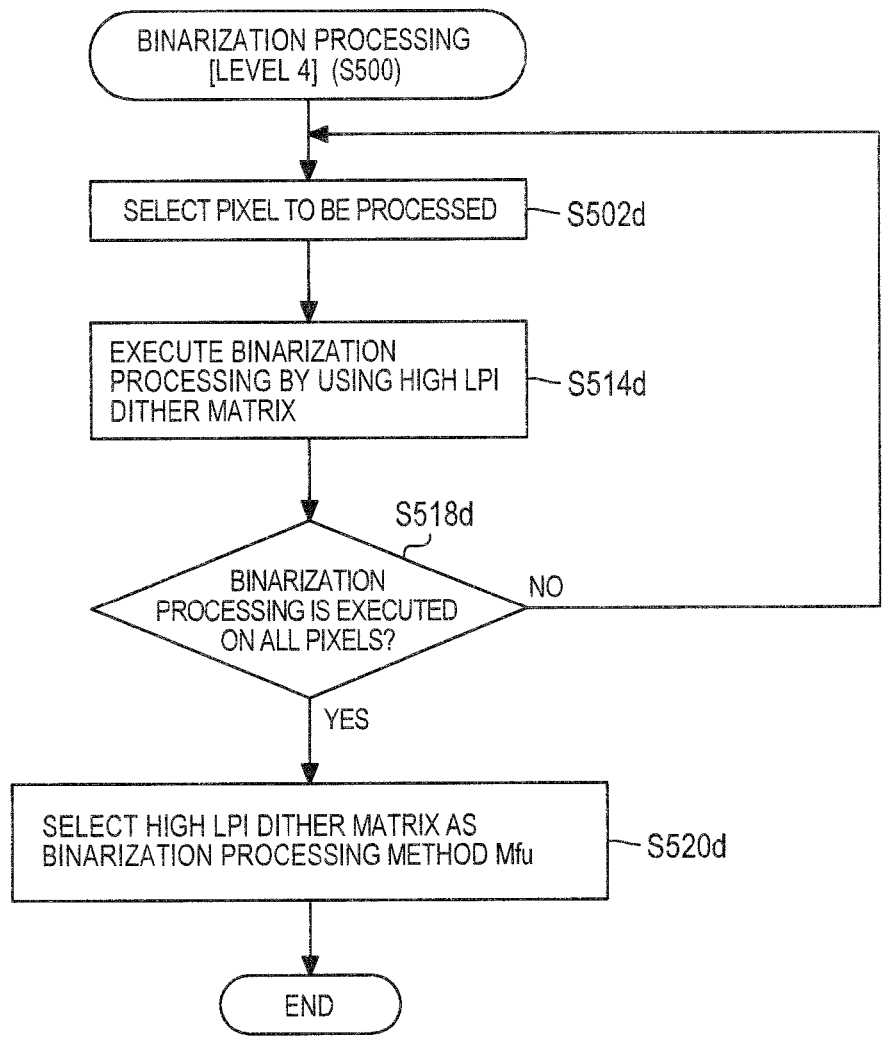
FIG. 16 is a flowchart showing binarization processing (Level 4)

FIG. 16 is a flowchart showing the binarization processing which is executed at Level 4.

Similarly to the binarization processing which is executed at Level 1, the binarization processing unit 53 selects a pixel to be processed (S502d). At Level 4, as shown in the binarization correspondence table 42 of FIG. 5, the binarization processing unit executes the binarization processing on all the pixels by using the high LPI dither matrix method (S514d). When the binarization processing is executed on all the pixels (YES in S518d), the specifying unit 58 specifies the high LPI dither matrix as the binarization processing method Mfu (S520d).

Figure 17:
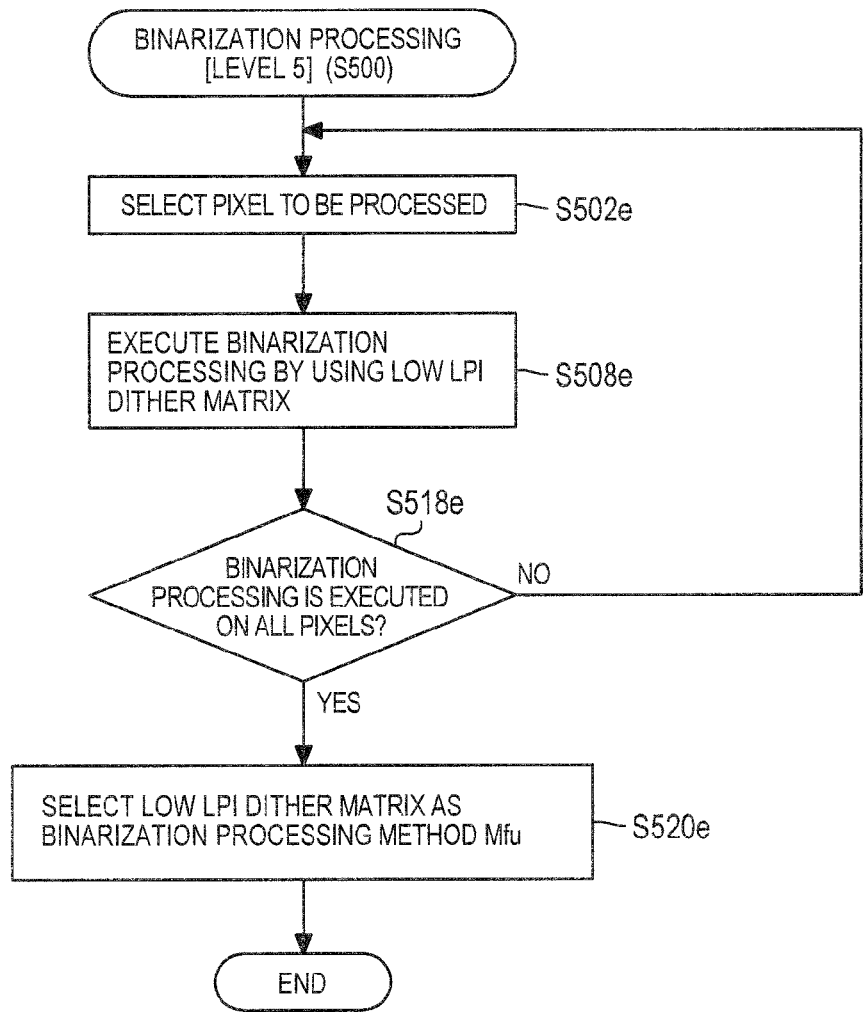
FIG. 17 is a flowchart showing binarization processing (Level 5).

FIG. 17 is a flowchart showing the binarization processing which is executed at Level 5.

Similarly to the binarization processing which is executed at Level 1, the binarization processing unit 53 selects a pixel to be processed (S502e). At Level 5, as shown in the binarization correspondence table 42 of FIG. 5, the binarization processing unit executes the binarization processing on all the pixels by using the low LPI dither matrix method (S508e). When the binarization processing is executed on all the pixels (YES in S518e), the specifying unit 58 specifies the low LPI dither matrix as the binarization processing method Mfu (S520d).

As described above, according to this illustrative embodiment, the binarization processing unit 58 executes the binarization processing according to the respective levels, based on the binarization correspondence table 42 of FIG. 5. In this illustrative embodiment, the compression processing unit 56 executes the compression processing on the binary image data Im4 by using the one type of compression processing method. However, as described above, the error diffusion method and the dither matrix method have the appropriate compression method, respectively. Specifically, the compression method appropriate for the error diffusion method is the Hate compression method, and the compression method appropriate for the dither matrix method is the previous line reference method. Therefore, when executing the binarization processing on the image data Im3, as the number of types of the binarization processing to be executed increases, the area in which the appropriate compression processing is executed is reduced, so that the compression efficiency is lowered. Thus, in this illustrative embodiment, the binarization correspondence table 42 is defined such that as the level to be set is higher, the types of the binarization processing to be executed is smaller. Accordingly, the compression processing unit 56 can increase the compression efficiency.

As described above, in order to enable the print execution unit (not shown) of the printer 70 to execute a print job, the terminal apparatus 10 executes the binarization processing of the specific level (for example, the binarization processing of Level 1 shown in FIG. 6) for the image data Im3 on which the color conversion processing (S300 in FIG. 2) has been executed, thereby generating the binary image data Im4. Then, the terminal apparatus 10 executes the compression processing (S700 to S900 in FIG. 2) on the binary image data Im4, thereby generating the compressed image data Im5. In S1100 of FIG. 2, the terminal apparatus 10 determines whether the size of the compressed image data Im5 is larger than the threshold value. When it is determined that the size of the compressed image data Im5 is larger than the threshold value, the terminal apparatus 10 executes the binarization processing (for example, the binarization processing of Level 2 shown in FIG. 14) different from the binarization processing of the specific level, thereby generating the binary image data. For example, when the binarization processing of a specific area has been executed by using the error diffusion method, as the binarization processing of the specific level, the binarization processing of the specific area is executed by using the high LPI dither matrix method as the binarization processing different from the binarization processing of the specific level. That is, when it is determined that the size of the compressed image data Im5 is larger than the threshold value, the terminal apparatus 10 can again generate the binary image data Im4 by using the appropriate binarization processing method. As a result, for example, the binary image data is again generated by the binarization processing which is executed at Level 2, instead of the binarization processing which is executed at Level 1, so that the compressed image data can be again generated.

Modified Illustrative Embodiments

While the present invention has been shown and described with reference to certain illustrative embodiments thereof, it will be understood by those skilled in the art that various changes in form and details may be made therein without departing from the spirit and scope of the invention as defined by the appended claims.

(1) In the above illustrative embodiment, the terminal apparatus 2 executes the image processing of FIG. 2. Instead, the printer 70 may execute the image processing of FIG. 2.

(2) In the above illustrative embodiment, the binarization is executed according to the binarization processing methods defined in the binarization correspondence table 42. However, the combinations of the binarization processing defined in the binarization correspondence table 42 may be different. For example, in the above illustrative embodiment, when the set level is Level 1, the binarization processing is executed for the character area by using the error diffusion method. However, the binarization processing may be executed by using the high LPI dither matrix method.

(3) In the above illustrative embodiment, when the binary image data Im4 is the image data on which the binarization processing has been executed by using the error diffusion method, the compression processing is executed by using the Hate compression method. However, the other compression method may be also used. For example, for the binary image data Im4 on which the binarization processing has been executed by using the error diffusion method, the compression processing may be executed by using the previous line reference compression method.

Also, in the above illustrative embodiment, when the binary image data Im4 is the image data on which the binarization processing has been executed by using the high LPI dither matrix method or low LPI dither matrix method, the compression processing is executed by using the previous line reference compression method. However, the other compression method may be also used. For example, for the binary image data Im4 on which the binarization processing has been executed by using the high LPI dither matrix method, the compression processing may be executed by using the flate compression method.

That is, at least, one binarization processing method may be associated with one compression method for the binary image data on which the binarization processing has been executed by using the one binarization processing method.

(4) In the above illustrative embodiment, the binarization processing method, which has been most used, is specified as the binarization processing method Mfu from among the binarization processing methods applied to the respective pixels included in the binary image data Im4, in 5600 of FIG. 2. However, the other configuration may be also used. For example, when a first type of binarization processing method (for example, low LPI dither matrix method) is applied with a specific ratio or higher (for example, 30% or higher), the compression processing may be executed by using the compression processing method relating to the first type of binarization processing method even when the binarization processing method is not most applied (i.e., even when a second type of binarization processing method (for example, error diffusion method) is most applied). That is, the specific compression processing method may be selected according to the number of using times of the fist type of binarization processing method and the number of using times of the second type of binarization processing method.

(5) In the above illustrative embodiment, the functions of the respective unit 51 to 61 are implemented as the control unit 20 executes the processing according to the image processing program 41. Instead, at least a part of the respective unit 51 to 61 may be implemented by hardware such as logic circuit or ASIC.

What is claimed is:

1. A control device comprising:
a processor; and
a memory that stores a computer program, when executed by the processor, causes the control device to function as:
a binarization processing unit which is configured to execute binarization processing on original image data by using at least one of plural types of binarization processing methods to generate binary image data, the plural types of binarization processing methods including a first type of binarization processing method and a second type of binarization processing method; and
a compression processing unit which is configured to execute compression processing on the binary image data to generate a compressed image data by using a specific compression processing method which is one of plural types of compression processing methods, the plural types of compression processing methods including a first type of compression processing method appropriate for compression of the binary image data generated by using the first type of binarization processing method, and a second type of compression processing method appropriate for compression of the binary image data generated by using the second type of binarization processing method,
wherein the compression processing unit includes:
a compression method selection unit which is configured, when the binary image data is generated by using two or more types of binarization processing methods including the first type of binarization processing method and the second type of binarization processing method, to select the specific compression processing method from the plural types of compression processing methods according to a number of using times of the first type of binarization processing method and a number of using times of the second type of binarization processing method, and
wherein the compression processing unit is configured to execute compression processing on the binary image data by using the selected specific compression processing method.

2. The control device according to claim 1,
wherein the compression method selection unit including:
a specifying unit which is configured, when the binary image data is generated by using the plural types of binarization processing methods, to specify a binarization processing method which is most used to generate the binary image data from the plural types of binarization processing methods, and wherein the compression method selection unit is configured
to select the first type of compression processing method as the specific compression processing method when the specifying unit specifies that the first type of binarization processing method is most used, and
to select the second type of compression processing method as the specific compression processing method when the specifying unit specifies that the second type of binarization processing method is most used.

3. The control device according to claim 2,
wherein the first type of binarization processing method uses an error diffusion method, and the second type of binarization processing method uses a dither matrix,
wherein the compression processing unit is configured, when the first type of binarization processing method is most used, to execute compression processing on the binary image data by using a first compression method appropriate for the binary image data in which a frequency of a specific pixel group configured by plural pixels appearing in the binary image data is smaller than a specific frequency, and
wherein the compression processing unit is configured, when the second type of binarization processing method is most used, to execute compression processing on the binary image data by using a second compression method appropriate for the binary image data in which a frequency of the specific pixel group configured by plural pixels appearing in the binary image data is the specific frequency or larger.

4. The control device according to claim 3,
wherein the first compression method is a flate compression method,
wherein the second compression method includes comparison processing and generation processing,
wherein the comparison processing includes comparing a pattern of pixels in a first row configuring the binary image data and a pattern of pixels in a second row adjacent to the first row, and
wherein the generation processing includes generating the compressed image data by a first method when the pattern of pixels in the first row and the pattern of pixels in the second row match with each other, and generating the compressed image data by a second method different from the first method when the pattern of pixels in the first row and the pattern of pixels in the first row do not match with each other.

5. The control device according to claim 4,
wherein the first method includes generating the compressed image data by using information indicating the number of times that the pattern of pixels in the first row appears in the binary image data, and
wherein the second method includes generating the compressed image data by a Run-Length Encoding method by using plural types of pixel groups including the specific pixel group.

6. The control device according to claim 5,
wherein the binarization processing unit is configured to execute the first type of binarization processing by using a first dither matrix having a first value of screen lines and to execute the second type of the binarization processing by using a second dither matrix having a second value of screen lines larger than the first value of screen lines,
wherein when the first type of binarization processing method is most used to generate the binary image data, the number of pixels configuring each of the plural types of pixel groups used in the second method is a first pixel number, and
wherein when the second type of binarization processing method is most used to generate the binary image data, the number of pixels configuring each of the plural types of pixel groups used in the second method is a second pixel number different from the first pixel number.

7. A non-transitory computer-readable medium having a computer program stored thereon that, when executed by the computer, causes the computer to perform operations comprising:
executing binarization processing on original image data by using at least one of plural types of binarization processing methods to generate binary image data, the plural types of binarization processing methods including a first type of binarization processing method and a second type of binarization processing method; and
executing compression processing on the binary image data to generate a compressed image data by using a specific compression processing method which is one of plural types of compression processing methods to generate a compressed image data, the plural types of compression processing methods including a first type of compression processing method appropriate for compression of the binary image data generated by using the first type of binarization processing method, and a second type of compression processing method appropriate for compression of the binary image data generated by using the second type of binarization processing method,
wherein the executing of the compression processing includes:
when the binary image data is generated by using two or more types of binarization processing methods including the first type of binarization processing method and the second type of binarization processing method, selecting the specific compression processing method from the plural types of compression processing methods according to a number of using times of the first type of binarization processing method and a number of using times of the second type of binarization processing method, and
wherein the compression processing on the binary image data is executed by using the selected specific compression processing method.

* * * * *